United States Patent
Goh et al.

(10) Patent No.: US 11,145,620 B2
(45) Date of Patent: Oct. 12, 2021

(54) FORMATION OF BONDING WIRE VERTICAL INTERCONNECTS

(71) Applicant: ASM Technology Singapore Pte Ltd, Singapore (SG)

(72) Inventors: Mow Huat Goh, Singapore (SG); Jiang Huang, Chengdu (CN); Ya Ping Zhu, Chengdu (CN); Chi Kwan Park, Singapore (SG); Keng Yew Song, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 287 days.

(21) Appl. No.: 16/292,469

(22) Filed: Mar. 5, 2019

(65) Prior Publication Data

US 2020/0286855 A1     Sep. 10, 2020

(51) Int. Cl.
*B23K 20/00* (2006.01)
*H01L 23/00* (2006.01)
*B23K 20/10* (2006.01)

(52) U.S. Cl.
CPC .............. *H01L 24/85* (2013.01); *B23K 20/00* (2013.01); *B23K 20/10* (2013.01); *H01L 24/05* (2013.01); *H01L 24/13* (2013.01); *H01L 24/43* (2013.01); *H01L 24/45* (2013.01); *H01L 24/48* (2013.01); *H01L 24/745* (2013.01); *H01L 24/78* (2013.01); *H01L 2224/78301* (2013.01); *H01L 2224/78621* (2013.01)

(58) Field of Classification Search
CPC .......................... B23K 20/007; B23K 20/004; B23K 2101/42; B23K 1/0008; B23K 31/02; B23K 35/0261
See application file for complete search history.

(56) References Cited

U.S. PATENT DOCUMENTS

| | | | | | |
|---|---|---|---|---|---|
| 3,623,649 | A * | 11/1971 | Keisling | ................. | H01L 24/85 228/15.1 |
| 5,176,310 | A * | 1/1993 | Akiyama | ................. | H01L 24/85 228/180.5 |
| 5,195,237 | A * | 3/1993 | Cray | ....................... | H01L 24/11 29/838 |
| 5,559,054 | A * | 9/1996 | Adamjee | ................. | H01L 24/11 438/617 |
| 7,044,357 | B2 * | 5/2006 | Mii | ........................ | H01L 24/85 228/180.5 |
| 7,229,906 | B2 * | 6/2007 | Babinetz | ................. | H01L 24/11 438/617 |
| 8,540,136 | B1 * | 9/2013 | Lin | ...................... | B23K 20/007 228/180.5 |
| 8,815,732 | B2 * | 8/2014 | Mii | ........................ | H01L 24/85 438/617 |
| 8,914,249 | B2 * | 12/2014 | Imaizumi | ............... | G01R 27/20 702/64 |
| 9,502,371 | B2 | 11/2016 | Colosimo, Jr. et al. | | |

(Continued)

*Primary Examiner* — Erin B Saad
(74) *Attorney, Agent, or Firm* — Ostrolenk Faber LLP

(57) ABSTRACT

A wire bonding method, comprising the steps of: extending a length of bonding wire from a capillary to form a wire tail; deforming a point on the wire tail to form a weakened portion between the wire tail and a remainder of the bonding wire retained within the capillary; and retracting at least a portion of the wire tail including the weakened portion into the capillary prior to bonding the wire tail to at least one of a bonding pad and a substrate.

14 Claims, 5 Drawing Sheets

(56) References Cited

U.S. PATENT DOCUMENTS

| | | | | |
|---|---|---|---|---|
| 2006/0175383 A1* | 8/2006 | Mii | ................ | H01L 24/85 |
| | | | | 228/180.5 |
| 2007/0187467 A1* | 8/2007 | Toyama | ................ | H01L 24/742 |
| | | | | 228/101 |
| 2013/0098877 A1* | 4/2013 | Song | ................ | H01L 24/78 |
| | | | | 219/69.11 |

* cited by examiner

FORMATION OF BONDING WIRE VERTICAL INTERCONNECTS

FIELD OF THE INVENTION

The invention relates to techniques for forming wire interconnect structures for semiconductor packages, and in particular to the formation of wire interconnect structures having vertical orientations.

BACKGROUND

A wire bonder may be used to form bond via array (BVA) wire interconnects at different locations on a substrate. Typically, a bonding wire is conveyed through a capillary. A free end of a bonding wire is bonded using the capillary to a bonding pad at a first location on the substrate. The capillary then moves from that location and, as it does, the bonded end causes more bonding wire to be conveyed through the capillary. The capillary then arrives at a second location on the substrate, arching the wire from the first location to the second location and presses against that location to weaken the bonding wire. After the capillary returns to a position above the bonding pad, the wire is gripped and pulled to leave a wire interconnect which is bonded at one end to the bonding pad and extends vertically from the bonding pad, terminating in a free end. The process is repeated at other locations to form the required wire interconnects. Such an approach is described in more detail in U.S. Pat. No. 9,502,371 (B2) entitled "Methods of Forming Wire Interconnect Structures".

Although the aforesaid approach is useful in providing vertical wire interconnects, it has undesirable consequences. In particular, there can be limitations of the device formats that the approach is capable of bonding. Accordingly, it is desirable to provide improved methods of forming vertical wire interconnect structures.

SUMMARY OF THE INVENTION

It is thus an object of this invention to seek to provide an approach which overcomes at least some of the aforementioned problems of the prior art.

According to a first aspect of the present invention, there is provided a wire bonding method, comprising the steps of:
extending a length of bonding wire from a capillary to form a wire tail;
deforming a point on the wire tail to form a weakened portion between the wire tail and a remainder of the bonding wire retained within the capillary; and
retracting at least a portion of the wire tail including the weakened portion into the capillary prior to bonding the wire tail to at least one of a bonding pad and a substrate.

The first aspect recognizes that a problem with existing approaches is that the wire tail is first fixed at its free end to a bonding pad or substrate and a weakened portion created by translating the capillary to a new location and pressing the tip of the capillary against the substrate at this new location. This causes the bonding wire to form an arch between the two locations, which introduces a bend in the bonding wire along its longitudinal length. Also, this requires sufficient space on the substrate between the two locations on the substrate to extend the wire tail to the desired length, as well as requiring the capillary to translate between different positions on the substrate. Furthermore, the first bond neck can be damaged during the various bending motions, the bending of the wire tail makes it difficult to maintain a straight, vertical orientation, spurious marking occurs at the new location when pressing the capillary at this location and the need for two locations present practical limitations on the height of the wire tails.

Accordingly, a method is provided. The method may be a method for wire bonding. The method may comprise the step of extending or providing a length of bonding wire from a capillary to form or provide an unbonded wire tail. The method may comprise deforming a point, location or position on the wire tail to form a weakened portion between the wire tail and the remaining bonding wire passing through the capillary. The method may comprise retracting or withdrawing at least that part of the wire tail which includes the weakened portion back into the capillary. In this way, the length of the wire tail can be selected without needing to translate the capillary between different locations. Also, the weakened portion between the wire tail and the remainder of the bonding wire can be created without needing to contact the capillary with a surface at two different locations, without forming an arching wire between those two locations or introducing a bend in the bonding wire along its longitudinal length. Furthermore, any bending of the bonding wire while forming the weakened portion can be straightened prior to bonding the wire tail to the bonding pad and/or substrate.

In one embodiment, the wire tail has a free end distal from the capillary and the weakened portion is proximate the capillary. Accordingly, the wire tail may have a free end and a weakened portion. The weakened portion may be provided towards the capillary and the free end may be is provided away from the capillary.

In one embodiment, the step of deforming comprises pressing the wire tail with the capillary against at least one of the substrate and the bonding pad. Accordingly, the weakened portion may be formed by pressing or pushing the point on the wire tail against the substrate and/or bonding pad with the capillary.

In one embodiment, the step of deforming comprises pressing the point on the wire tail against at least one of the substrate and the bonding pad.

In one embodiment, the step of deforming comprises translating the wire tail towards at least one of the substrate and the bonding pad to contact the free end against at least one of the substrate and the bonding pad, continued translation of wire tail causing the free end to move over a surface of at least one of the substrate and the bonding pad out of axial alignment with the remainder of the bonding wire retained within the capillary. Accordingly, the wire tail may be moved towards the substrate and/or bonding pad. This causes the free end to touch against the substrate and/or bonding pad. As the wire tail continues to move, the free end moves across the surface of the substrate and/or bonding pad. This causes the wire tail to move out of axial alignment with the remaining bonding wire located within the capillary.

In one embodiment, the step of deforming comprises displacing the capillary in a displacement direction towards at least one of the substrate and the bonding pad while translating the capillary in a direction transverse the displacement direction. By translating the capillary in one direction while moving in the displacement direction, this helps the wire tail to move out of axial alignment with the capillary.

In one embodiment, the step of deforming comprises compressing a cross section of the wire tail to form the weakened portion. Accordingly, the weakened portion may be formed by compressing or squeezing the wire tail.

In one embodiment, the step of deforming further comprises the step of forming the wire tail around a tip of the capillary. Accordingly, the tip of the capillary may be shaped to facilitate the movement of the wire tail out of axial alignment and to facilitate the formation of the weakened portion.

In one embodiment, the step of retracting further includes the step of aligning the wire tail with respect to the remainder of the bonding wire retained within the capillary prior to bonding. Accordingly, withdrawing the wire tail into the capillary helps to restore axial alignment of the wire tail with the remainder of the bonding wire and the capillary.

In one embodiment, the retracting comprises retracting the weakened portion into the capillary.

In one embodiment, the method comprises forming a bond ball on the free end of the wire tail prior to bonding.

In one embodiment, the method comprises displacing the bond ball to bond with the bond pad to form a ball wire bond In one embodiment, the method comprises repeatedly translating the capillary in directions transverse the displacement direction to weaken the weakened portion.

Translating the capillary helps to further weaken the weakened portion.

In one embodiment, the method comprises aligning an opening of the capillary through which the bonded wire extends proximate the weakened portion while repeatedly translating the capillary in the direction transverse the displacement direction to weaken the weakened portion. Locating the weakened portion next to the outside of the opening of the capillary helps to maximize the weakening of the weakened portion.

In one embodiment, the method comprises displacing the remainder of the bonding wire and gripping the remainder of the bonding wire to detach it from the ball wire bond at (the point of) the weakened portion.

According to a second aspect, there is provided an apparatus configured to perform the method of the first aspect and its embodiments.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments of the invention in any more detail, first an overview will be provided. In one embodiment, a length of wire is released from a capillary and the unbonded wire is pre-cut (deformed, typically by compression to form a wedge) at a first bond position. The wire is then retracted leaving a wire tail, and a free-air ball is formed at the wire tail in order to make the first bond. After the first bond is made, the capillary is lifted and the wire is broken.

Figure 1:
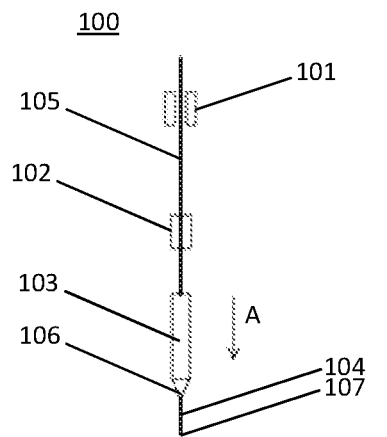
FIG. 1 illustrates the main components of a wire bonding apparatus used to form wire interconnects according to one embodiment.
Figure 1:

FIG. 1 illustrates the main components of a wire bonding apparatus 100 used to form wire interconnects according to one embodiment. Other components of the wire bonding apparatus 100 have been omitted to improve clarity. A capillary 103 is provided which is axially-aligned with wire holding mechanisms, such as a proximal wire clamp 102 and a distal wire clamp 101. A continuous length of bonding wire 105 provided from a bonding wire reel (not shown) passes through the wire clamps 101, 102 as well as through the capillary 103. The bonding wire 105 is free to pass through the capillary 103, but the wire clamps 101, 102 are operable to independently clamp or unclamp the bonding wire 105. The distal wire clamp 101 has a generally fixed height, whereas the proximal wire clamp 102 is independently displaceable along the axial direction of the bonding wire 105, as will be explained in more detail below.

As can be seen in FIG. 1, the bonding apparatus 100 is positioned above a bonding location where a wire interconnect is to be located such as, for example, above a bonding pad 202 on the substrate 201. The distal wire clamp 101 is not gripping the bonding wire 105, but the proximal wire clamp 102 is gripping the bonding wire 105. A length of bonding wire 105 has been passed through the capillary 103 (which is located at a reset level), such that the bonding wire 105 extends from a tip 106 of the capillary 103 to form a wire tail 104. Such wire tail 104 may be obtained, for instance, from the execution of a previous wire bonding operation. Hence, a wire tail 104 is located above the bonding pad 202 in readiness to be conveyed in direction A towards the bonding pad 202.

Figure 2:
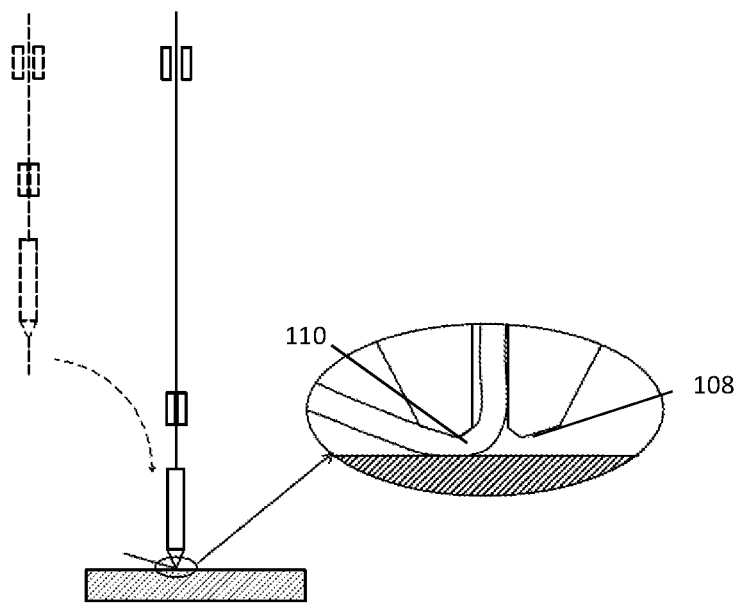
FIGS. 2 to 9 illustrate operation of the wire bonding apparatus when making wire bond interconnects according to the preferred embodiment of the invention.

Turning now to FIG. 2, the proximal wire clamp 102 and the capillary 103 move together towards the substrate 201 generally in the direction A. The distal wire clamp 101 remains unclamped to enable the wire to move. As illustrated in FIG. 2, the proximal wire clamp 102 and the capillary 103 move towards the bonding pad 202 along a curved trajectory by translating the capillary 103 in a direction transverse to the direction A during movement of the capillary 103 to facilitate bending of the wire tail 104 when the wire tail 104 contacts the substrate 201.

Thus, when a free end 107 of the wire tail 104 extending out of the tip 106 contacts the substrate 201, such contact causes the wire tail 104 to bend and lie generally along the surface of the substrate 201. The mechanical properties of the bonding wire 105 are such that it is generally prone to bend sharply about the tip 106 with the tail 104 remaining generally straight. Hence, a tight elbow bend 110 occurs between the wire tail 104 and the remainder of the bonding wire 105 within the capillary 103. This leads to a generally right-angled bend in the vicinity of the tip 106, with the elbow bend 110 being formed around and following the shape of the tip 106. The tip 106 is chamfered and shaped to define an annular projection 108 which helps shape a corner bend.

Optionally, the orientation of the capillary 103 may be altered off-axis to help the wire tail 104 contact the substrate 201 at a more oblique angle to facilitate bending.

Continued movement of the capillary 103 in the direction A causes the annular projection 108 to deform the bonding wire 105 by creating an indentation, compression, recess or wedge in the vicinity of the annular projection 108 to provide a weakened portion or point between the wire tail 104 and the remaining bonding wire 105 within the capillary 103. In other words, the capillary 103 moves down to bend and deform the wire tail using cherry-pit bonding. Alternatively, other than using the annular projection 108 of the capillary 103, deformation of the bonding wire 105 may also be achieved by the introduction of an external tool (not shown).

Thus, as can be seen in FIG. 2, the wire tail 104 has been bent out of alignment with the remaining bonding wire 105 within the capillary 103. Furthermore, a weakened portion therebetween has been created.

Figure 3:
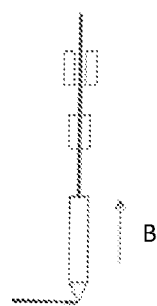
Figure 3:

As can be seen in FIG. 3, the distal wire clamp 101 remains unclamped and the capillary 103 and the proximal wire clamp 102 move together in the direction B, away from the substrate 202. This elevates the wire tail 104 away from the substrate 202 and the capillary returns to the reset level.

Figure 4:
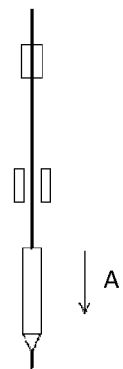
Figure 4:

As can be seen in FIG. 4, the distal wire clamp 101 now clamps the bonding wire 105 and the proximal wire clamp 102 unclamps the bonding wire 105. The distal wire clamp 101 is operative to hold onto the bonding wire while the proximal wire clamp 102 and the capillary 103 are lowered in direction A away from the distal wire clamp 101. This causes the wire tail 104 to be at least partially received or drawn back within the capillary 103. In particular, the weakened portion on the elbow bend 110 is withdrawn into the capillary 103 and as it does the wire tail 104 is re-straightened to align with the remainder of the bonding wire 105. Accordingly, the bonding wire is restored to the configuration shown in FIG. 1 but now with a wire tail 104 formed with a desired length and with the weakened portion located within the capillary 103.

Figure 5:
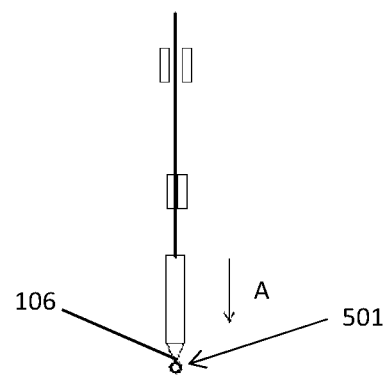

Turning now to FIG. 5, a distal portion of the wire tail 104 protruding from the tip 106 has a bond ball 501 formed using conventional techniques. The distal wire clamp 101 unclamps and the proximal wire clamp 102 clamps the bonding wire 105. The proximal wire clamp 102 together with the capillary 103 then moves in the direction A towards the bonding pad 202 on the substrate 201.

Figure 6:
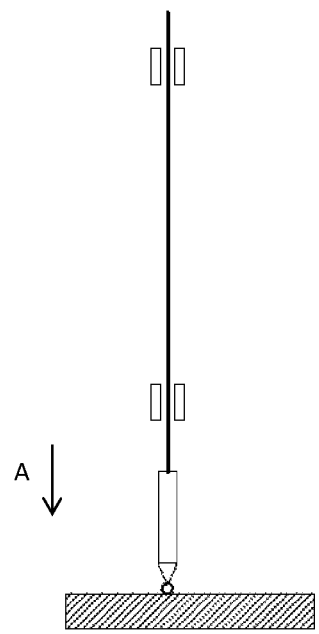

As can be seen in FIG. 6, the bond ball 501 makes contact with the bonding pad 202 to form a wire bond. The proximal wire clamp 102 then unclamps the bonding wire 105.

Figure 7:
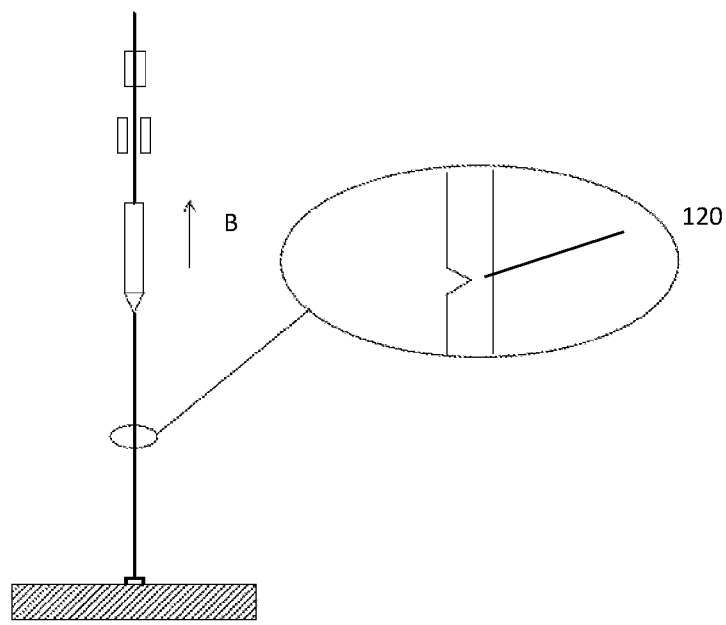

As can be seen in FIG. 7, the distal wire clamp 101 clamps the bonding wire 105 to prevent it moving while the proximal wire clamp 102, together with the capillary 103, move back up along the bonding wire in the direction B. Hence, the capillary 103 is retracted back along the bonding wire 105 leaving the wire tail 104 bonded to the bonding pad 202, with the weakened portion 120 between the wire tail 104 and the remainder of the bonding wire 105. When the capillary 103 is at the position of the weakened portion 120, the capillary 103 may be further translated repeatedly in directions transverse to the direction B to help further weaken the weakened portion 120.

Thereafter, the proximal wire clamp 102 together with the capillary 103 are further moved up to form a wire tail 104 of a required length for conducting subsequent wire bonding operations.

Figure 8:
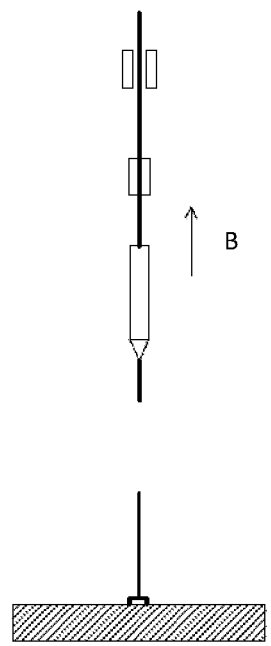

As can be seen in FIG. 8, the proximal wire clamp 102 then clamps the bonding wire 105 and the proximal wire clamp 102, together with the capillary 103 move further in direction B. This movement causes the remainder of the bonding wire 105 to move while the wire tail 104 is retained on the bonding pad 202 by the ball wire bond. This causes the wire to break at the weakened portion 120, leaving the wire tail 104 in place in a vertical orientation.

Figure 9:
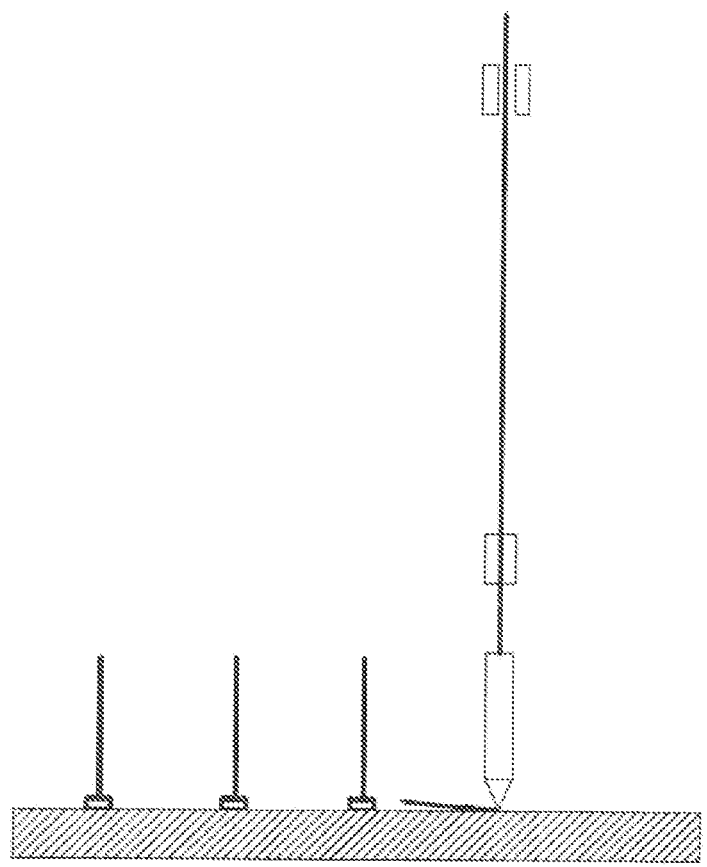

As can be seen in FIG. 9, this process is repeated with adjacent wire tails 104 being bonded at different positions on the substrate 201.

As would be appreciated, unlike in existing approaches, the wire tails 104 are not curved along their length since the wire tails 104 have never been bent as a arching wire between two points on the substrate 201. Also, the sharp elbow bend 110 formed as shown in FIG. 2 is further straightened as shown in FIG. 4 prior to bonding occurring. Furthermore, because the wire tail 104 can be formed and bent at any single location, rather than having to form a arching wire between two locations, the limitation on bonding on substrates that have obstacles around the bond point which obstruct the making of the deformation at a second point around the bond point can be avoided. Moreover, as fewer translational movements are required, vertical interconnect orientation accuracy is increased. Neck stress on the wire bond can also be avoided since it is unnecessary to create a bend in a neck of the wire bond after wire bonding in order to form the weakened portion 120.

Embodiments experience no neck damage of the wire tails unlike that observed with conventional approaches. The wire tail straightness is also improved compared to conventional approaches. The accuracy of wire tail placement (specifically the X&Y offset in orthogonal directions transverse to the displacement direction A/B) may be improved by around 50% compared to conventional approaches. The wire cutting position and first bond position can be the same, which obviates the need for additional space to cut/deform the wire. A wider range of different wire tail heights is therefore possible compared to conventional approaches.

Although the present invention has been described in considerable detail with reference to certain embodiments, other embodiments are possible.

Therefore, the spirit and scope of the appended claims should not be limited to the description of the embodiments contained herein.

The invention claimed is:

1. A wire bonding method, comprising the steps of:
   extending a length of bonding wire from a capillary to form a wire tail;
   deforming a point on the wire tail to form a weakened portion between an unweakened portion of the wire tail and a remainder of the bonding wire retained within the capillary; and
   retracting at least a portion of the wire tail including the weakened portion into the capillary prior to bonding the wire tail to at least one of a bonding pad and a substrate.

2. The method of claim 1, wherein the wire tail has a free end distal from the capillary and the weakened portion is proximate the capillary.

3. The method of claim 1, wherein the step of deforming comprises pressing the wire tail with the capillary against at least one of the substrate and the bonding pad.

4. The method of claim 1, wherein the step of deforming comprises pressing the point on the wire tail against at least one of the substrate and the bonding pad.

5. The method of claim 2, wherein the step of deforming comprises translating the wire tail towards at least one of the substrate and the bonding pad to contact the free end of the wire tail against at least one of the substrate and the bonding pad, continued translation of the wire tail causing the free end to move over a surface of at least one of the substrate and the bonding pad out of axial alignment with the remainder of the bonding wire retained within the capillary.

6. The method of claim 1, wherein the step of deforming comprises displacing the capillary in a displacement direction towards at least one of the substrate and the bonding pad while translating the capillary in a direction transverse the displacement direction.

7. The method of claim 1, wherein the step of deforming comprises compressing a cross section of the wire tail to form the weakened portion.

8. The method of claim 1, wherein the step of deforming further comprises the step of forming the wire tail around a tip of the capillary.

9. The method of claim 1, wherein the step of retracting further includes the step of aligning the wire tail with respect to the remainder of the bonding wire retained within the capillary prior to bonding.

10. The method of claim 1, comprising forming a bond ball on the free end of the wire tail prior to bonding.

11. The method of claim 10, comprising displacing the bond ball to bond with the bond pad to form a ball wire bond.

12. The method of claim 6, comprising repeatedly translating the capillary in directions transverse the displacement direction to further weaken the weakened portion.

13. The method of claim 12, comprising aligning an opening of the capillary through which the bonded wire extends proximate the weakened portion while repeatedly translating the capillary in the direction transverse the displacement direction to further weaken the weakened portion.

14. The method of claim 1, comprising displacing the remainder of the bonding wire and gripping the remainder of the bonding wire to detach it from a ball wire bond at the weakened portion.

* * * * *